United States Patent [19]

Mako et al.

[11] Patent Number: 4,598,247

[45] Date of Patent: Jul. 1, 1986

[54] SPECTRUM ANALYZER AND ANALYSIS METHOD FOR MEASURING POWER AND WAVELENGTH OF ELECTROMAGNETIC RADIATION

[75] Inventors: Frederick M. Mako, Fairfax Station; John A. Pasour, Springfield; Charles W. Roberson, Alexandria, all of Va.

[73] Assignee: The United States of America as represented by the Secretary of the Navy, Washington, D.C.

[21] Appl. No.: 583,536

[22] Filed: Feb. 24, 1984

[51] Int. Cl.$^4$ ............................................. G01R 23/16
[52] U.S. Cl. .............................. 324/77 R; 324/77 B; 324/95
[58] Field of Search ..................... 324/58.5 R, 58.5 A, 324/58.5 B, 77 R, 77 K, 77 B, 77 D, 77 G, 95

[56] References Cited

U.S. PATENT DOCUMENTS

| | | | |
|---|---|---|---|
| 2,643,286 | 6/1953 | Hurvitz | 324/77 K |
| 2,810,883 | 10/1957 | Carnine | 324/28 |
| 3,667,038 | 5/1972 | Cutler et al. | 324/77 R |
| 3,738,731 | 6/1973 | Chandra et al. | 324/77 K |
| 4,443,107 | 4/1984 | Alexander et al. | 356/358 |

FOREIGN PATENT DOCUMENTS 838605  6/1981  U.S.S.R. .................. 324/77 R

OTHER PUBLICATIONS

C. W. Roberson et al., "A Free-Electron Laser Driven by a Long-Pulse Induction Linac"; Infrared and Millimeter Waves, vol. 10 Millimeter Components and Techniques, Part II; 1983; pp. 361-398.

F. Mako et al., "A Broadband High Power Millimeter to Centimeter Spectrometer", NRL Report No. 4945; May 20, 1983.

C. W. Roberson et al., "A Free Electron Laser Driven by a Long Pulse Induction Linac"; NRL Memorandum Report 5013; Mar. 7, 1983.

*Primary Examiner*—Stewart J. Levy
*Assistant Examiner*—Kevin D. O'Shea
*Attorney, Agent, or Firm*—Robert F. Beers; Sol Sheinbein; William R. Sharp

[57] ABSTRACT

A spectrum analyzer for analyzing electromagnetic radiation which may be utilized to determine the radiation wavelength and power. The analyzer includes a gas filled chamber which has a collimating lens through which radiation is injected, and a reflective plate that reflects the radiation back toward the lens. A standing wave is created within the chamber having spatially periodic peaks. The chamber gas pressure is regulated to a pressure such that gas breakdown occurs, thereby generating a light pattern at each standing wave peak. The patterns are then photographed, and the patterns' diameters and spacing are measured from the resulting photograph. From the spacing and diameter obtained, wavelength and power may be calculated.

11 Claims, 3 Drawing Figures

SPECTRUM ANALYZER AND ANALYSIS METHOD FOR MEASURING POWER AND WAVELENGTH OF ELECTROMAGNETIC RADIATION

BACKGROUND OF THE INVENTION

This invention relates to spectrum analysis of electromagnetic radiation, and more particularly to the measurement of both wavelength and power of such electromagnetic radiation.

Recently, there has been considerable interest in generating high power (i.e. several kW) electromagnetic waves from relativistic electron beams, such as in free electron lasers. Important parameters in such experiments which must be measured are wavelength and power. Prior spectrum analyzer means for measuring power and wavelength of such high power waves include calorimeters, calibrated diode detectors, microwave spectrometers, dispersive lines, and interferometers. These devices typically have limited bandwidth (less than 1 octave), require extensive calibration, and are not well-suited to high power operation. Most are relatively difficult and expensive to build. Dispersive lines are simple, but are not practical for microsecond or longer pulses. Diode detectors are inexpensive but to use them for high-power measurements requires the insertion of so much attenuation that absolute power measurements are not convincing. Interferometers such as the Fabry-Perot type are relatively simple and inexpensive, but they are limited to use with relatively sharp spectra. Also, a large number of reproducible pulses is required to determine the frequency. Finally, to simultaneously determine the frequency spectrum and power it is necessary to use two separate conventional devices.

SUMMARY OF THE INVENTION

It is therefore, an object of the present invention to provide a spectrum analyzer which is suited to high power radiation.

It is also an object of this invention to provide a spectrum analyzer which is inexpensive.

It is also an object of this invention to provide a spectrum analyzer which is relatively simple.

It is a further object of this invention to provide a spectrum analyzer which will measure both power and wavelength of electromagnetic radiation.

The above objects are realized by a spectrum analyzer which includes a gas filled chamber into which radiation to be analyzed is injected. The chamber includes a transparent medium capable of transmitting radiation therethrough into the interior of tne chamber, and a reflective boundary positioned to reflect the incident radiation back toward the transparent medium. A standing wave is thereby generated in the chamber, the standing wave having spatially periodic amplitude peaks. A gas regulation means is also provided to regulate the gas pressure in the chamber to a pressure at which gas breakdown occurs at the standing wave peaks so as to generate a visible light pattern at each peak.

Wavelength $\lambda$ is found utilizing the apparatus above by measuring the spacing $d_1$ between the light patterns, and computing the wavelength from the formula $$2d_1 \cos \alpha_i,$$

where $\alpha_i$ is the angle of reflection of the reflective boundary. The power may be found by first computing the breakdown electric field $E_b$ from the formula $$AP\{1+(a/P\lambda)^2\}^{\frac{1}{2}},$$

where A is the pressure-normalized effective field constant for the chamber gas, a is the modified inverse momentum transfer collision frequency constant, $\lambda$ is the wavelength, and P is pressure. The A and a constants are further defined in the detailed description of the invention. The diameter $d_2$ of the light patterns are measured, enabling calculation of power from the formula, $$\frac{\pi}{8} \epsilon_o E_b^2 c \, d_2^2.$$

The spectrum analyzer as described above is capable of analyzing high power radiation. The spectrum analyzer is also very simple and inexpensive to contruct and use. Furthermore, the analyzer is capable of measuring power and wavelength simultaneously.

DESCRIPTION OF THE PREFERRED EMBODIMENTS

A spectrum analyzer is described herein which includes a gas breakdown chamber into which radiation to be analyzed is injected. Power and wavelength of the radiation may be determined from light patterns produced in the chamber.

Figure 1:
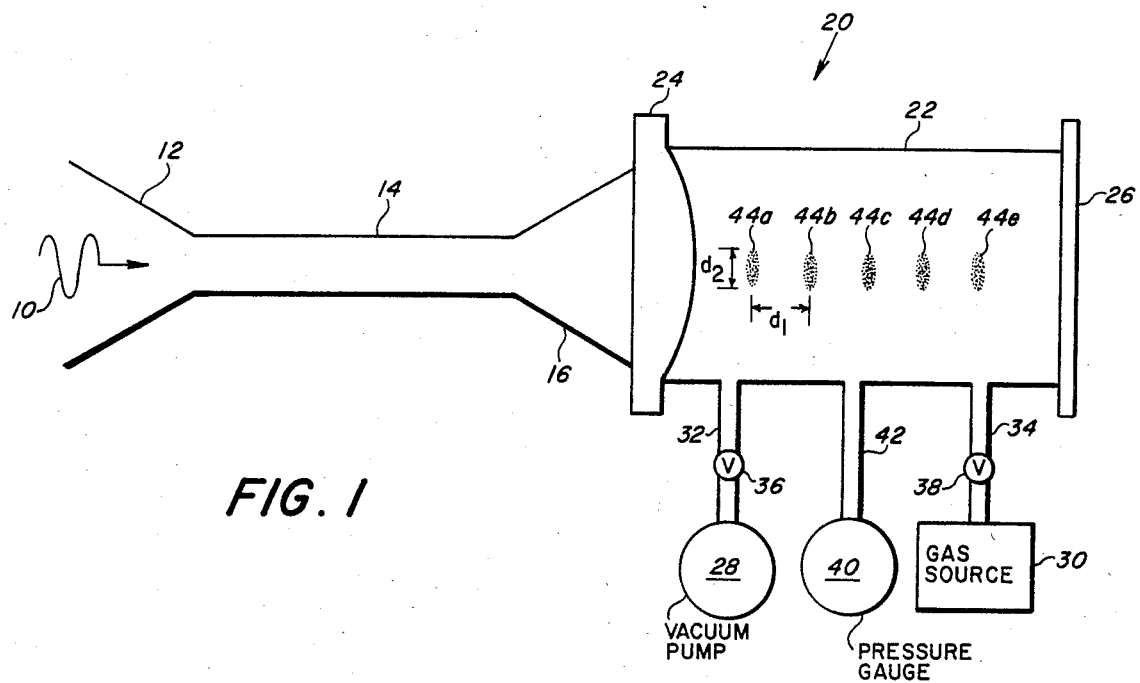
FIG. 1 is a schematic side view diagram of a spectrum analyzer according to the present invention.

Referring now to FIG. 1, one embodiment of the present spectrum analyzer is shown in schematic form. An electromagnetic wave to be analyzed is injected into a horn 12, which is conveniently realized by an outwardly flared end of high pass filter 14. High pass filter 14 is a metallic tube whose dimensions are determined according to the frequencies which are desired to pass through the tube. Filter 14 acts as a high pass filter, filtering out frequencies below a certain value. This is a preferred but optional feature of the present device which is further discussed in regard to device operation. Radiation from filter 14 is transmitted into horn 16.

Radiation from horn 16 is transmitted to chamber 20. Chamber 20 includes a tube 22 of a material transparent to visible light: a collimating lens 24 of, for example, teflon or polyethylene, mounted on one end of tube 22; and a metallic plate 26 mounted on the other end of tube 22.

Although element 22 is shown as being a tube, it may be of any geometric shape, as long as radiation is allowed to pass between collimating lens 24 and metallic plate 26. In addition, tube 22 may have only a portion of which is transparent, as in, for example, a metallic structure having a window. The metal used for metallic plate 26 is not particularly critical, as long as the plate will reflect electromagnetic waves of the frequency being measured. Possible metals for plate 26 include copper, gold, aluminum, etc. Alternatively. certain nonmetallic materials could be substituted for metallic plate 26, such as certain plastics which are good reflectors.

Radiation entering chamber 20 is collimated or weakly focused by lens 24 so as to collect radiation and focus it on plate 26. Thus, inclusion of lens 24 serves to insure that input radiation to chamber 20 is about the same amplitude as the radiation reflected by plate 26. Radiation transmitted through lens 24 is received and reflected by plate 26 back toward lens 24. Consequently, a standing wave is created within the interior of chamber 20 which has spatially periodic amplitude peaks.

Also provided in the spectrum analyzer of FIG. 1 is a vacuum pump 28 and gas source 30 connected to chamber 20 by conduits 32 and 34 respectively. As shown, valves 36 and 38 are included along conduits 32 and 34 for regulating the pressure in chamber 20 as will be discussed below. The gas provided to chamber 20 by gas source 30 may be virtually any gas, such as air, nitrogen, oxygen etc. As shown, a pressure gauge 40 connected to chamber 20 via conduct 42 is also included for measuring and displaying the pressure within chamber 20. Typical operating chamber pressures range from about 1 Torr to about 1300 Torr.

At certain chamber pressures, gas breakdown occurs for particular radiation wavelengths at the standing wave peaks. This gas breakdown generates visible light patterns 44$a$-$e$. Each light pattern has a diameter $d_2$, as measured in a direction perpendicular to the radiation propagation direction. Also, the distance between each light pattern is shown as being $d_1$, as measured between the geometric centers of the light patterns.

Also, provided in the FIG. 1 device is a camera (not shown in FIG. 1) for photographing light pattern 44$a$-$e$. This camera is shown and discussed in reference to FIG. 2.

Figure 2:
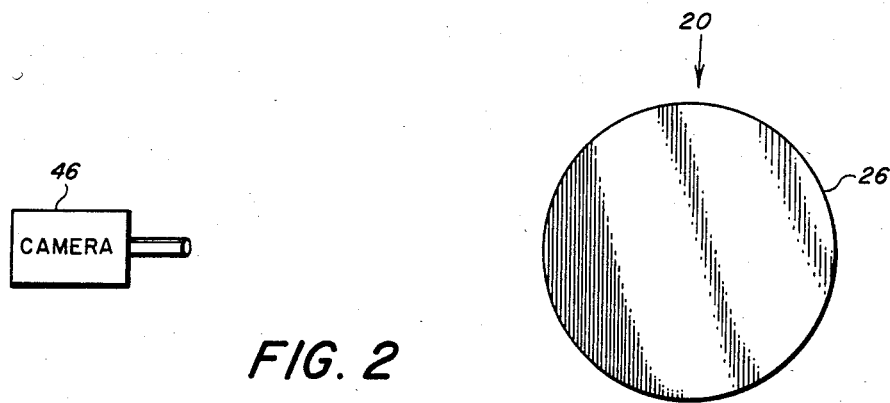
FIG. 2 is an end view of the spectrum analyzer which shows a camera for photographing light patterns in the analyzer.

Referring to FIG. 2, there is shown an end view of chamber 20 wherein plate 26 is shown. A conventional still photographic camera 46 is provided external to chamber 20 which is positioned to photograph light patterns generated within chamber 20. As already noted, tube 22 of chamber 20 is a material capable of transmitting visible light therethrough, such that the light pattern images may be photographed by camera 46. The positioning of camera 46 is not particularly critical, as long as the camera is positioned so that a photograh may be obtained from which the light pattern dimension and spacings may be conveniently measured.

An alternate embodiment of the present spectrum analyzer include a flat window for transmitting radiation into the chamber, and a concave reflective plate for accomplishing the collimation achieved by the collimating lens in the FIG. 1 embodiment. Another embodiment might include a flat window and a flat reflective plate. However, this arrangement will not give optimum results since no means is provided to collimate the radiation beam.

The device described in reference to the illustrated embodiment may be operated to determine the wavelength and power of electromagnetic radiation as follows. First, radiation from a source. e.g. an electron laser, is injected into the device. Valve 38 is opened to allow gas from source 30 into chamber 20 until a certain pressure chosen by the operator is reached as measured by gauge 40. This intial pressure may be purely arbitrary, or as is more typical in actual practice, may be a pressure at which the operator expects gas breakdown might occur. The pressure may then have to be raised or lowered, depending on what is observed in chamber 20, as will be discussed below. To increase the chamber pressure, valve 38 is opened so as to permit more gas from source 30 to enter chamber 20. If a lower pressure is desired, the valve 38 can be closed, followed by the opening of valve 36 such that vacuum pump 28, which is continually running, can pump gas from the chamber.

If upon the initial pressure setting, no light is observed in chamber 20, then the chamber pressure is typically lowered. The pressure is lowered at this stage because if no patterns whatsoever are seen evidencing no breakdown, this usually indicates that the breakdown electric field is above the peak total RMS electric field at which no breakdown is possible. The pressure must be lowered to a point at which the breakdown electric field is slightly below the maximum RMS field, at which point a plurality of discrete light patterns are observed.

Another possibility is, that upon the initial pressure setting. light will be observed evidencing breakdown. However, the light will be smeared such that a plurality of discrete light patterns are not formed. In this condition, the breakdown electric field is substantially below the incoming total RMS field. If this condition is observed, the pressure is typically increased until a plurality of discrete light patterns are observed.

In either case of pressure regulation discussed above, the discrete light patterns eventually formed with the final pressure setting correspond to a particular wavelength, whose determination will be described below.

After the chamber pressure has been adjusted to give optimal resolution of the light patterns, certain dimensions of the patterns must be measured utilizing camera 46 before wavelength and power can be calculated. An operator of the device opens the shutter of camera 46 in a conventional manner to expose film in the camera with light emanating from chamber 20. The resulting photograph shows the plurality of light patterns generated in chamber 20.

At this point, the spacing between adjacent light patterns $d_1$ are measured from the images on the photograph. The actual spacing between the light pattern images in the photograph is first measured. One may determine $d_1$ from the measurement above by simply calibrating the photograph by referring to the image of an object of known dimensions. For example, the photographic image of the plate 26 may be measured and compared to its actual size to give a reference ratio also applicable to the light patterns. Furthermore, this calibration can be most easily achieved by first photographing the chamber in full light to obtain the above reference ratio, followed by the photographing of the light patterns. Spacing $d_1$ is measured between the geometric centers of the adjacent light patterns.

In a manner similar to that described above, the light pattern diameter $d_2$ is measured from the resulting photograph.

As noted above, each light pattern is generated at a peak in the standing wave created in chamber 20. Gas breakdown occurs at the peaks, which results from interference between the reflected and incident waves. Gas breakdown occurs at about half wavelength intervals apart. Thus, the wavelength is related to the light pattern spacing $d_1$ by $$\lambda = 2d_1 \cos \alpha_i,$$

where $\alpha_i$ is the angle of reflection off of plate 26. This angle of reflection is the angle between a wave incident on plate 26 and the reflected wave. $\alpha_i$ can be calculated in the case of the FIG. 1 embodiment using a lens from the formula $$\tan(\alpha_i) = \frac{D/2}{d},$$

where D is the lens diameter, and d is the image distance which can be calculated from the expression $$d = \frac{-1}{\left[\frac{1}{d_o} - (n-1)\left(\frac{1}{R_1} - \frac{1}{R_2}\right)\right]},$$

where $d_o$ is the object distance. $d_o$ is approximately equal to the distance from the mouth (at the lens) of horn 16 to its throat (at end of high pass filter 14), n is the index of refraction of lens 24 at the radiation frequency, $R_1$ is the radius of curvature of the face of lens 24 facing plate 26, and $R_2$ is the radius of curvature of the other face of lens 24.

To determine power of the radiation, the breakdown electric field must first be calculated from the semi-empirical formula $$E_b = AP\{1 + (a/P\lambda)^2\}^{\frac{1}{2}},$$

where A and a are gas constants for the gas in chamber 20, P is gas pressure, and $\lambda$ is the radiation wavelength as determined above. Constant a has been called the modified inverse momentum transfer collision frequency constant, and A has been called the pressure-normalized effective field constant. Set forth below is a table showing constants A and a for nine different gases.

| Gas Type | A(Vm$^{-1}$Torr$^{-1}$) | a(Torr-m) |
|---|---|---|
| neon | 250 | 28.35. |
| argon | 570 | 10.01 |
| hydrogen(H$_2$) | 1,060 | 4.38 |
| krypton | 1,200 | 4.84 |
| nitrogen(N$_2$) | 1,833 | 1.24 |
| xenon | 2,170 | 4.06 |
| air | 2,857 | 1.02 |
| oxygen(O$_2$) | 3,875 | 0.817 |
| sulfur-hexafluoride (SF$_6$) | 11,905. | 0.620 |

One can derive constants A and a for any gas as follows. In respect to A, this constant $= E_e/P$, where Ehd e is the effective electric field and P is pressure. The effective electric field is essentially the field actually experienced by electrons in a gas when exposed to an electric field E. From quantum mechanics one can derive the collision frequency for momentum transfer $\nu_m$. This collision frequency may than be used in the Boltzman equation to derive $E_e$ for a particular gas. $E_e$ is then used in the expression above to get A. As to constant a, this constant $= P2\pi c/\nu_m$, where P is pressure, c is the speed of light, and $\nu_m$ is the collision frequency for momentum transfer, which is derivable as discussed above. For a detailed discussion of $\nu_m$, $E_e$, and the Boltzman equation, see *Microwave Breakdown in Gases* by A. D. MacDonald, John Wiley & Sons, Inc. (1966), of which Chapters 2, 4 and 5 are herein incorporated by reference.

The formula for $E_b$ agrees with MacDonald's precision data in the worst case to within 30%. This formula is valid for pulse lengths (pulses from a free electron laser for example) of greater than about 1 microsecond, for example, a low repetition rate (by way of example, less than about 100 pps), and for no electron collisions with chamber walls. The $E_b$ formula could be modified for pulse lengths less than 1 microsecond (see P. Felsenthal, *Journal of Applied Physics*, volume 37, p. 4557 (1966) and P. Felsenthal & J. M. Proud, *Physics Review*, vol. 137, p. A1796 (1965)).

Power can now be computed from the light pattern diameter $d_2$ and breakdown electric field $E_b$ from the expression $$\frac{\pi}{8} \epsilon_o E_b^2 c \, d_2^2,$$

where $\epsilon_o$ is the permittivity of free space constant, and c is the speed of light, wherein units are in the mks system.

After wavelength and power have been calculated at a certain pressure, the chamber pressure is typically increased and decreased with respect to the above pressure such that the pressure is varied over a wide range of pressures (from for example 1 Torr to several hundred Torr). In this way, other wavelength components present in the radiation being analyzed may be detected by observing light patterns generated at certain pressures as a result of gas breakdown. Wavelength and power for each set of light patterns observed are calculated as previously explained.

Figure 3:
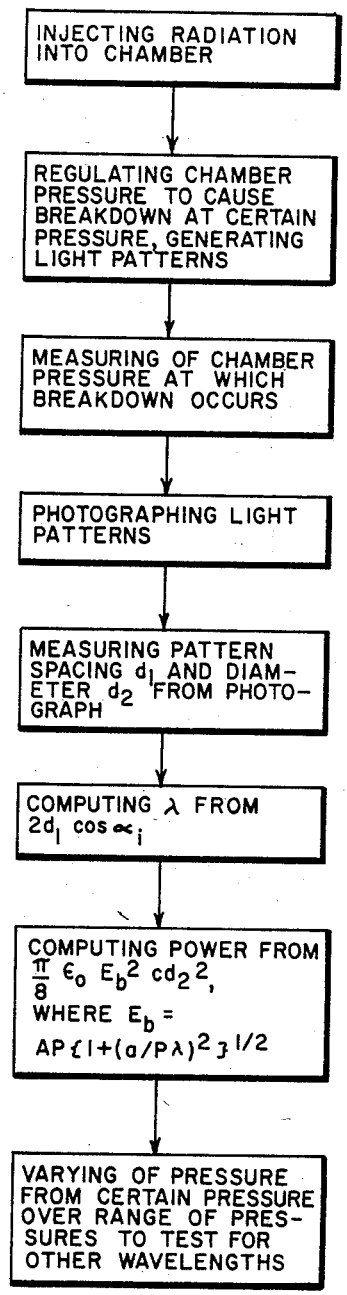
FIG. 3 is a flow chart which outlines the steps in determining the wavelength and power of electromagnetic radiation which is injected into the FIG. 1 apparatus.

A flow chart is shown in FIG. 3, which summarizes the various steps in determining wavelength and power as outlined above.

A concrete example wherein wavelength and power was determined with a spectrum analyzer similar to the illustrated embodiment will now be described.

In the present example, microwaves were generated when a 130A, 550 keV, 2 microsecond long electron beam was passed through a "wiggler" magnetic field. The resulting radiation was injected through an aluminum 5 cm diameter tube-high pass filter having entrance and exit horns which widen to 12.5 cm in diameter. The analyzer also included an air filled chamber having a microwave transparent lens and a copper reflective plate which reflects the microwave radiation. White light patterns were generated at a measured pressure of 25 Torr. These light patterns were photographed. Type 57 (ASA 3000) Polaroid film was used with a Graphflex camera (f/4.5). The gas density was selected experimentally so that enough light was available to be recorded photographically, but the density was not high enough to allow microwave reflections from the gas-breakdown generated plasma.

From the resulting photograph, the light pattern spacing $d_1$ was measured to be 2.25 cm, and the frequency was calculated as being 6.67 GHz. The breakdown electric field $E_b$ was calculated as being 1 kV/cm, where, for air, A = 2857 Vm$^{-1}$Torr$^{-1}$ and a = 1.02 Torr-m, P = 25 Torr, and $\lambda$ = 4.5 cm. The light pattern diameter $d_2$ was measured from the photograph, and used to calculate a power of 8 kW.

For a detailed discussion of the above example and associated apparatus, operation. and theory, reference is made to NRL Memorandum Report No. 4945 by F.

Mako, J. A. Pasour, C. W. Roberson, and R. Lucey entitled "A Broadband High Power Millimeter to Centimeter Spectrometer", whose disclosure is herein incorporated by reference.

Thus, there is provided by the present invention a spectrum analyzer which utilizes a chamber wherein gas breakdown generates light patterns. Dimensions of the patterns may be measured to give power and wavelength. The device is very simple, inexpensive, and is suited to the analysis of high power radiation.

Obviously many modifications and variations of the present invention are possible in light of the above teachings. It is therefore to be understood that within the scope of the appended claims the invention may be practiced otherwise than as specifically described.

What is claimed is:

1. A spectrum analyzer for analyzing electromagnetic radiation comprising:
   a chamber having chamber walls, said chamber having a gas therein, and wherein said chamber includes a transparent medium means capable of transmitting radiation therethrough into the interior of said chamber, and a reflective boundary means positioned to receive radiation transmitted into the interior of said chamber, said reflective boundary means being capable of reflecting radiation back toward said transparent medium means such that a standing wave having spatially periodic amplitude peaks is generated within said chamber;
   pressure regulation means for regulating the gas pressure within said chamber;
   whereby gas breakdown will occur at the standing wave peaks at a certain pressure for a particular radiation wavelength, the gas breakdown generating a visible light pattern at each standing wave peak.

2. A spectrum analyzer as recited in claim 1, wherein at least a portion of said chamber walls is transparent to visible light generated within said chamber, the apparatus further comprising photographic means outside of said chamber for photographing the visible light patterns.

3. A spectrum analyzer as recited in claim 2, further comprising a means for measuring the gas pressure within said chamber.

4. A spectrum analyzer as recited in claim 3, wherein said transparent medium means is a collimating lens.

5. A spectrum analyzer as recited in claim 4, wherein said reflective boundary means is metallic.

6. A spectrum analyzer as recited in claim 5, further comprising a tube having two ends, wherein one end is mounted to the collimating lens, and the other end is for receiving electromagnetic radiation, said tube transmitting radiation therethrough.

7. A spectrum analyzer as recited in claim 6, wherein each end of said tube is outwardly flared so as to form a horn.

8. A method of determing the wavelength and power of electromagnetic radiation comprising the steps of:
   injecting the electromagnetic radiation in a predetermined direction into a gas filled chamber which includes a reflective boundary, such that the radiation is incident on the reflective boundary, the radiation being reflected such that the reflected radiation interferes with radiation incident on said reflective boundary thereby generating a standing wave having spatially periodic amplitude peaks within the chamber;
   regulating the gas pressure within said chamber such that gas breakdown occurs at each peak for a particular wavelength so as to generate a visible light pattern at each peak, each visible light pattern having a diameter $d_2$ as measured in a direction perpendicular to the predetermined direction;
   measuring the gas pressure P at which gas breakdown occurs;
   measuring the spacing $d_1$ between each light pattern and a light pattern adjacent to each said light pattern, the spacing being measured between the geometric centers of said light patterns;
   measuring the diameter $d_2$ of each said light pattern;
   computing the wavelength $\lambda$ of the radiation from the formula $$2d_1 \cos \alpha_i,$$

where $\alpha_i$ is defined as the angle of reflection of the radiation off the reflective boundary;
   computing the power of the radiation by first computing the breakdown electric field $E_b$ from the formula $$AP\{1+(a/P\lambda)^2\}^{\frac{1}{2}},$$

where A is the pressure normalized effective field constant for the gas, a is the modified inverse momentum transfer collision frequency constant for the gas, P is the chamber pressure, and $\lambda$ is the radiation wavelength, and then computing the power from the formula $$\frac{\pi}{8} \epsilon_o E_b^2 c d_2^2,$$

where $\epsilon_o$ is the permittivity of free space constant, $E_b$ is the breakdown electric field, c is the speed of light, and $d_2$ is the light pattern diameter, wherein all units are in the mks system.

9. A method as recited in claim 8, wherein the spacing $d_1$ and diameter $d_2$ are measured by photographing said light patterns and measuring the values $d_1$ and $d_2$ from the resulting photograph.

10. A method as recited in claim 9, wherein the gas pressure is regulated such that the gas pressure is varied over a range of pressures such that a plurality of radiation wavelengths are tested for.

11. A spectrum analyzer for analyzing electromagnetic radiation comprising:
   a chamber having chamber walls, said chamber having a gas therein, and wherein said chamber includes a collimating lens capable of transmitting radiation therethrough into the interior of said chamber, and a reflective metallic plate positioned to receive radiation transmitted into the interior of said chamber, said metallic plate being capable of reflecting radiation back toward said collimating lens such that a standing wave having spatially periodic amplitude peaks is generated within said chamber, and wherein at least a portion of said chamber walls is transparent to visible light;
   pressure regulations means for regulating the gas pressure within said chamber, whereby gas breakdown will occur at the standing wave peaks at a certain pressure for a particular radiation wavelength, the gas breakdown generating a visible light pattern at each standing wave peak;
   means for measuring the gas pressure within said chamber; and
   photographic means positioned outside of said chamber for photographing light from said visible light patterns, said light being transmitted through the portion of said chamber transparent to visible light.

* * * * *